(12) United States Patent
Nagahisa

(10) Patent No.: US 9,246,446 B2
(45) Date of Patent: Jan. 26, 2016

(54) CHOPPER AMPLIFIER

(71) Applicant: Takeshi Nagahisa, Toyonaka (JP)

(72) Inventor: Takeshi Nagahisa, Toyonaka (JP)

(73) Assignee: RICOH COMPANY, LTD., Tokyo (JP)

( * ) Notice: Subject to any disclaimer, the term of this patent is extended or adjusted under 35 U.S.C. 154(b) by 0 days.

(21) Appl. No.: 14/248,452

(22) Filed: Apr. 9, 2014

(65) Prior Publication Data

US 2014/0312967 A1    Oct. 23, 2014

(30) Foreign Application Priority Data

Apr. 23, 2013 (JP) ................. 2013-090371

(51) Int. Cl.
| | |
|---|---|
| H03F 1/02 | (2006.01) |
| H03F 3/185 | (2006.01) |
| H03F 3/393 | (2006.01) |
| H03F 3/45 | (2006.01) |

(52) U.S. Cl.
CPC ............... *H03F 3/185* (2013.01); *H03F 3/393* (2013.01); *H03F 3/45995* (2013.01); *H03F 2200/271* (2013.01); *H03F 2200/333* (2013.01)

(58) Field of Classification Search
CPC ........................................................ H03F 1/02
USPC ...................................... 330/9; 327/124, 307
See application file for complete search history.

(56) References Cited

U.S. PATENT DOCUMENTS

| | | | |
|---|---|---|---|
| 5,261,407 A | 11/1993 | Nishigaki et al. | |
| 2006/0244521 A1 | 11/2006 | Yoshida et al. | |
| 2008/0191800 A1 * | 8/2008 | Fang et al. | ......................... 330/9 |
| 2011/0018533 A1 | 1/2011 | Cesaretti et al. | |
| 2011/0316621 A1 * | 12/2011 | Burt et al. | ......................... 330/9 |
| 2013/0284931 A1 | 10/2013 | Nagahisa et al. | |
| 2014/0139285 A1 * | 5/2014 | Maderbacher et al. | ........... 330/9 |

FOREIGN PATENT DOCUMENTS

| | | |
|---|---|---|
| EP | 0488545 A2 | 6/1992 |
| JP | 2006-153492 | 6/2006 |
| JP | 2006-279377 | 10/2006 |

OTHER PUBLICATIONS

European Search Report dated Dec. 23, 2014 in corresponding. European patent application No. 14 16 4784.2.
A Low-Noise CMOS Instrumentation Amplifier for Thermoelectric Infrared Detectors, Christian Menolfi et al., IEEE Journal of Solid-State Circuits, vol. 32, No. 7, Jul. 1997.

* cited by examiner

*Primary Examiner* — Henry Choe
(74) *Attorney, Agent, or Firm* — Cooper & Dunham LLP

(57) ABSTRACT

A chopper amplifier includes a chopper modulator to modulate a certain detection signal and a bias voltage by a certain control signal and output a chopper modulation signal, a first differential amplifier to differentially amplify the chopper modulation signal from the chopper modulator and output a differential modulation signal, a chopper demodulator to demodulate the differential modulation signal from the first differential amplifier by the control signal and output a demodulation signal, a second differential amplifier to extract a detection signal component from the demodulation signal, and a plurality of filters connected at an input terminal of the second differential amplifier and having different cutoff frequencies from each other relative to the demodulation signal.

4 Claims, 10 Drawing Sheets

CHOPPER AMPLIFIER

CROSS REFERENCE TO RELATED APPLICATION

The present application is based on and claims priority from Japanese Patent Application No. 2013-90371, filed on Apr. 23, 2013, the disclosure of which is hereby incorporated by reference in its entirety.

BACKGROUND OF THE INVENTION

1. Field of the Invention

The present invention relates to a chopper amplifier which amplifies a finite, low-frequency signal.

2. Description of the Related Art

In related art Japanese Patent Application Publication No. 2006-279377 discloses a chopper amplifier to amplify a finite, low frequency detection signal, for example.

Such a chopper amplifier comprises a chopper modulator to modulate a finite, low-frequency input signal by a certain control signal and output a modulation signal, a differential amplifier to differentially amplify the modulation signal, and a chopper demodulator to demodulate the differentially amplified modulation signal in accordance with the control signal for output.

FIG. 5 shows an example of typical chopper amplifier and FIGS. 6A to 6F show voltage waveforms and frequency spectra at nodes of the chopper amplifier in FIG. 5. FIG. 6A show gate control signals $\phi1$, $\phi2$. A chopper modulator 1 and a chopper demodulator 2 in FIG. 5 each comprise NMOS transistors. The NMOS transistors become conductive when high-level gate control signals $\phi1$, $\phi2$ are applied to their gates while they become non-conductive when low-level signals are applied thereto.

FIG. 6B shows a voltage (signal) S1 from a signal source and a voltage B1 from a bias source. The bias source constantly outputs a DC voltage to supply a bias voltage to the amplifier. FIG. 6C shows a frequency spectrum of the signal S1, and FIG. 6D shows the output of a modulator, that is, a signal obtained by modulating the voltage waveform in FIG. 6B by the chopper modulator 1. FIG. 6E shows that the signal S1 with a frequency component $f_s$ is converted into a signal with a frequency component $f_{chop} \pm f_s$, $3f_{chop} \pm f_s$, . . . .

In FIG. 6F the signal is amplified by the amplifier with a gain A. FIG. 6G shows the spectrum of the output voltage of the amplifier, and it can be seen therefrom that a 1/f noise and the signal of the amplifier are frequency-separated. In FIG. 6H the output voltage of the amplifier is demodulated by the chopper demodulator 2. In FIG. 6I the frequency of the signal component is returned to the one before the conversion and the 1/f noise of the amplifier is converted by the chopper demodulator 2 to be in a frequency band near the $f_{chop}$.

In FIGS. 6J, 6K only the 1/f noise is cut off by a lowpass filter (LPF) and the signal S1 is output from the signal source without change. That is, the chopper amplifier works to move the signal in a low frequency range to a high frequency range, separate the frequency band of the signal component and the 1/f noise, and amplify the signal.

However, there is a problem with the chopper amplifier that a residual offset applied to a voltage of the output OUT of the LPF due to clock feedthrough occurring when the $N_{ch}$ transistor switches of the chopper modulator 1 are transited from a non-conductive state to a conductive state.

This is mainly caused by a mismatch between the output resistances of the signal source and the bias source, that between the gate-source capacitances of the transistor switches, or that between the input capacitances of the two input terminals of the amplifier. An example is described below.

FIG. 7 is a circuit diagram of a chopper amplifier by way of example, showing an output resistance R1 of a signal source S1, an output resistance R2 of a bias source B1, gate-source capacitances $C_{gs}$ of four $N_{ch}$ transistors of a modulator, and input capacitances C of + and − input terminals of an amplifier. For the sake of simplicity, assumed that the gate-source capacitances $C_{gs}$ of the transistor switches are the same and so are the input capacitances C of the + input terminals, and a mismatch occurs only between the output resistances R1 and R2, and R1<R2. When the switches inside the modulator are shifted from a non-conductive state to a conductive state, the gate potentials of the $N_{ch}$ transistors of the switches transit from GND to VDD, injecting a charge into a source (clock feedthrough). Because of this, the output voltages of the signal source S1 and bias source B1 rise by $V_{ing}$ for a moment where $V_{ing}=V_{dd}(C_{gs}/(C_{gs}+C))$. The charge injected into the capacitance C by the clock feedthrough is discharged towards the signal source and bias source. In FIG. 8B transient responses of the signal source and the bias source when the charge is discharged is shown. Since the output resistance R2 of the bias source B1 is larger than that R1 of the signal source S1, it takes a longer time for the output resistance R2 to settle than the output resistance R1. This causes a spike in the output waveform of the amplifier immediately after the switching of the modulator switch (FIG. 8D). The spike waveform passes through the demodulator without a change and is applied to the LPF, as shown in FIG. 8E. The voltage that the LPF outputs is a mean value of the waveform in a certain time so that the voltage corresponding to the spike waveform becomes an offset added to the output voltage of the LPF. In FIG. 8F the spike waveform applied to the input of the amplifier appears as a certain residual offset in the output voltage of the LPF.

SUMMARY OF THE INVENTION

The present invention aims to provide a chopper amplifier which can remove residual offsets.

According to one embodiment, a chopper amplifier comprises a chopper modulator to modulate a certain detection signal and a bias voltage by a certain control signal and output a chopper modulation signal, a first differential amplifier to differentially amplify the chopper modulation signal from the chopper modulator and output a differential modulation signal, a chopper demodulator to demodulate the differential modulation signal from the first differential amplifier by the control signal and output a demodulation signal, a second differential amplifier to extract a detection signal component from the demodulation signal; and a plurality of filters connected at an input terminal of the second differential amplifier and having different cutoff frequencies from each other relative to the demodulation signal.

BRIEF DESCRIPTION OF THE DRAWINGS

Features, embodiments, and advantages of the present invention will become apparent from the following detailed description with reference to the accompanying drawings.

DETAILED DESCRIPTION OF THE PREFERRED EMBODIMENTS

Hereinafter, embodiments of a chopper amplifier according to the present invention will be described in detail with reference to the accompanying drawings. Wherever possible, the same reference numbers will be used throughout the drawings to refer to the same or like parts.

First Embodiment

Figure 1:
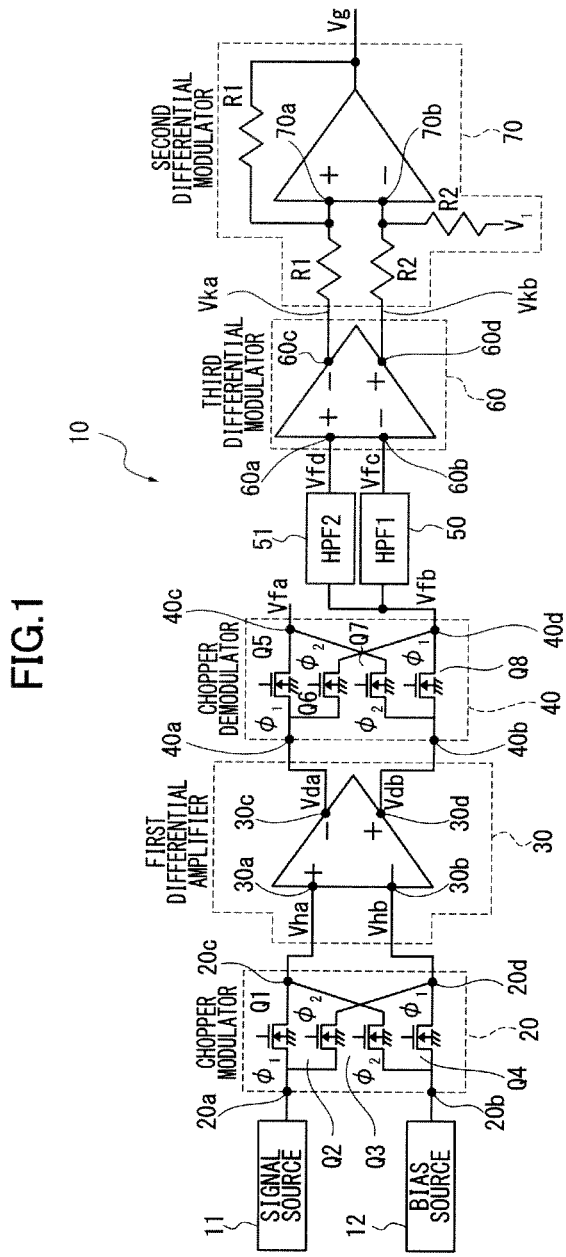
FIG. 1 is a circuit diagram of a chopper amplifier according to a first embodiment.

FIG. 1 shows the structure of a chopper amplifier 10. The chopper amplifier 10 comprises a chopper modulator 20 to modulate a detection signal from a signal source 11 and a bias voltage as a certain DC voltage from a bias source 12 and a differential amplifier 30 to differentially amplify a voltage or chopper modulation signal output from the chopper modulator 20.

The chopper amplifier 10 further comprises a chopper demodulator 40 to demodulate a differential output voltage from the first differential amplifier 30 and output a demodulation signal, first and second highpass filters 50, 51 to cut off a low frequency component of the demodulation signal from the chopper demodulator 40 and output a modulation signal, a third differential amplifier 60 to differentially amplify the modulation signal from the highpass filters 50, 51, and a second differential amplifier 70 to differentially amplify a differential modulation signal from the third differential amplifier 60.

The signal source 11 is for example a temperature sensor or an image sensor to output a detection signal which is a finite, low-frequency signal.

The chopper modulator 20 in FIG. 1 comprises four NMOS transistors Q1 to Q4, input terminals 20a, 20b for the detection signal from the signal source 11 and the bias voltage from the bias source 12, respectively, and output terminals 20c, 20d. A gate control signal φ1 in FIG. 6A is applied to the gates of the NMOS transistors Q1, Q4 while a gate control signal φ2 is applied to the gates of the NMOS transistors Q2, Q3.

The NMOS transistors Q1, Q4 are connected at their sources to the input terminals 20a, 20b and at their drains to the output terminals 20c, 20d. The NMOS transistor Q2 is connected at its source to the input terminal 20a and at its drain to the output terminal 20d. The NMOS transistor Q3 is connected at its source to the input terminal 20b and at its drain to the output terminal 20c.

Figure 6A:
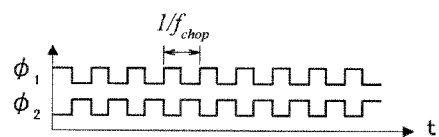
FIGS. 6A to 6K show the voltage waveforms and frequency spectra at nodes of the chopper amplifier in FIG. 5.
Figure 6B:
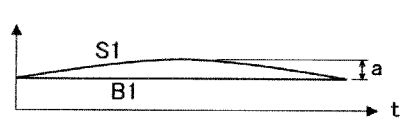
Figure 6C:
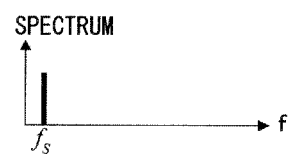
Figure 6D:
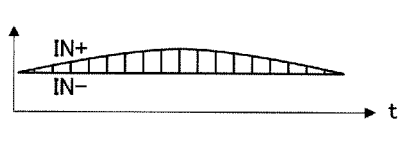
Figure 6E:
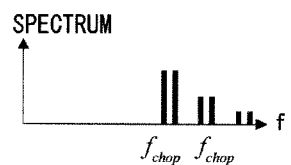

As shown in FIG. 6A, the gate control signals φ1, φ2 are pulse voltages with the same frequency and alternatively turn to high level. The chopper modulator 20 outputs the detection signal of the signal source 11 from the output terminal 20c and the bias voltage of the bias source 12 from the output terminal 20d while the gate control signal φ1 is in high level. It outputs the bias voltage from the output terminal 20c and the detection signal from the output terminal 20d while the gate control signal φ2 is in high level. Thus, the chopper modulator 20 outputs first and second chopper modulation signals from the output terminals 20c, 20d.

The first differential amplifier 30 is a fully differential amplifier and comprises two input terminals 30a, 30b and two output terminals 30c, 30d. It outputs, from the output terminal 30c, a first reduced modulation voltage obtained by subtracting the voltage of the input terminal 30a from that of the input terminal 30b. Also, it outputs, from the output terminal 30d, a second reduced modulation voltage obtained by subtracting the voltage of the input terminal 30b from that of the input terminal 30a.

The chopper demodulator 40 comprises four NMOS transistors Q5 to Q8, input terminals 40a, 40b connected to the output terminals 30c, 30d of the first differential amplifier 30, and output terminals 40c, 40d. The gate control signal φ1 in FIG. 1A is applied to the gates of the NMOS transistors Q5, Q8 while the gate control signal φ2 is applied to the gates of the NMOS transistors Q6, Q7.

The NMOS transistors Q5, Q8 are connected at their sources to the input terminals 40a, 40b and at their drains to the output terminals 40c, 40d. The NMOS transistor Q6 is connected at its source to the input terminal 40a and at its drain to the output terminal 40d. The NMOS transistor Q7 is connected at its source to the input terminal 40b and at its drain to the output terminal 40c.

The chopper demodulator 40 outputs, from the output terminals 40c, 40d, the output voltages of the output terminals 30c, 30d of the first differential amplifier 30 while the gate control signal φ1 is in high level. It outputs the output voltage or a first demodulation signal of the output terminal 30d of the first differential amplifier 30 from the output terminal 40c and outputs the output voltage or a second demodulation signal of the output terminal 30c from the output terminal 40d while the gate control signal φ2 is in high level.

The cutoff frequency $F_{c1}$ (first frequency) of the first highpass filter 50 is set to be lower than a frequency $F_{in}$ of the detection signal of the signal source 11. It is configured to cut off frequencies lower than or equal to the cutoff frequency and allow frequencies over the cutoff frequency to pass through. The first highpass filter 50 is connected to the output terminal 40d of the chopper demodulator 40.

The cutoff frequency $F_{c2}$ (second frequency) of the second highpass filter 51 is set to be higher than the frequency $F_{in}$ of the detection signal of the signal source 11. It is configured to cut off frequencies lower than or equal to the cutoff frequency and allow frequencies over the cutoff frequency to pass through. The cutoff frequency $F_{c2}$ is set such that $F_{c2} \ll F_{chop}$ where $F_{chop}$ is the frequency of the gate control signals φ1, φ2. The second highpass filter 51 is connected to the output terminal 40d of the chopper demodulator 40.

The third differential amplifier 60 is a fully differential amplifier and comprises two input terminals 60a, 60b and two output terminals 60c, 60d. The input terminal 60a is connected to the second highpass filter 51 while the input terminal 60b is connected to the first highpass filter 50. It outputs, from the output terminals 60c, a voltage or a first demodulation signal obtained by subtracting the voltage of the input terminal 60a from that of the input terminal 60b. Also, it outputs, from the output terminals 60d, a voltage or a second demodulation signal obtained by subtracting the voltage of the input terminal 60b from that of the input terminal 60a.

The input terminals 70a, 70b of the second differential amplifier 70 are connected to the output terminals 60c, 60d of the third differential amplifier 60 via resistances R1, R1.

The output voltage Vg of the output terminals of the second differential amplifier 70 is expressed by the following formula:

$$Vg=(R1/R1)\times(Vka-Vkb)+V1$$

where Vka is a voltage input to the input terminal 70a and Vkb is a voltage input to the input terminals 70b. Since (R1/R1)=1, the voltage of (Vka−Vkb) added with V1 is output.

Figure 2:
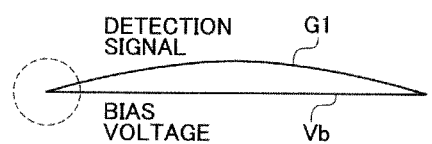
FIG. 2 shows a detection signal and a bias voltage.

Next, the operation of the chopper amplifier 10 is described. Assumed that a detection voltage or a detection signal G1 is output from the signal source 11 and a bias voltage Vb is output from the bias source 12 as shown in FIG. 2. A mismatch occurs between the output resistances (not shown) of the signal source 11 and bias source 12, and the output resistance of the signal source 11 is smaller than that of the bias source 12. The gate-source parasite capacitances Cgs of the switches of the NMOS transistors Q1 to Q4 completely match with each other and so do the parasite capacitances C of the + and − input terminals 30a, 30b of the OPamp of the first differential amplifier 30.

Figure 3A:
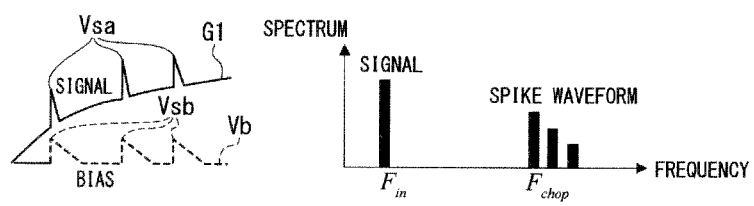
FIGS. 3A to 3G show the voltage waveforms and frequency spectra at nodes of the chopper amplifier in FIG. 1.

The chopper modulator 20 modulates the detection signal G1 and bias voltage Vg by the gate control signals φ1, φ2 and the frequency $F_{chop}$. The NMOS transistors Q1 to Q4 are transited from a non-conductive state to a conductive state for the modulation, which causes clock feedthrough. Spike waveforms $V_{ss}$, $V_{sb}$ due to the clock feedthrough are superimposed on the detection voltage G1 and bias voltage Vb, as shown in FIG. 3A. The graph in FIG. 3A shows the frequency of the detection voltage G1 and the frequency spectrum of a spike noise or spike waveform. Note that the waveforms therein are enlarged from a portion surrounded by a broken line in FIG. 2.

Figure 3B:
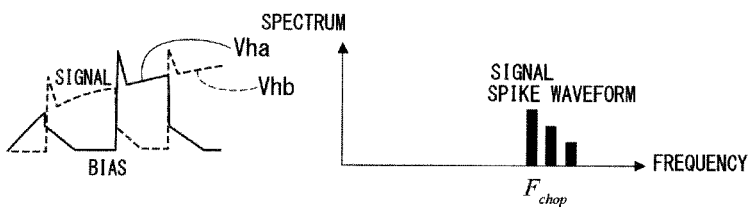

The chopper modulator 20 turns on and off the NMOS transistors Q1 to Q4 by the gate control signals φ1, φ2 for modulation to thereby output modulation voltages Vha, Vhb or chopper modulation signals from the output terminals 20c, 20d, as shown in FIG. 3B. The modulation voltages Vha, Vhb are input to the input terminals 30a, 30b of the first differential amplifier 30, respectively.

Figure 3C:
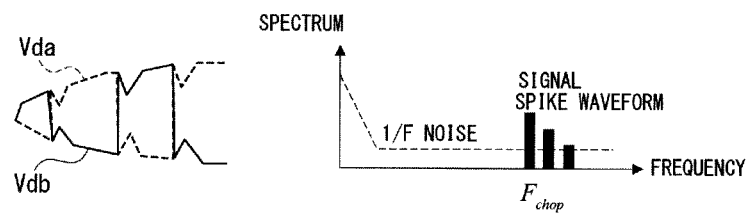
Figure 6F:
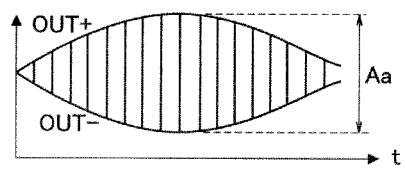
Figure 6G:
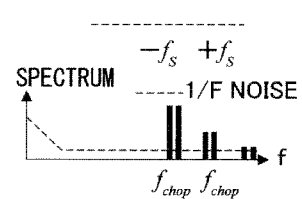
Figure 6H:
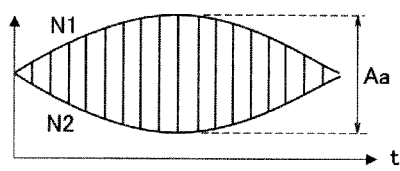
Figure 6I:
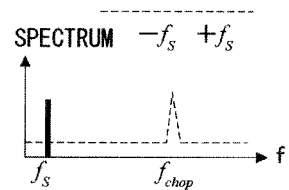
Figure 6J:
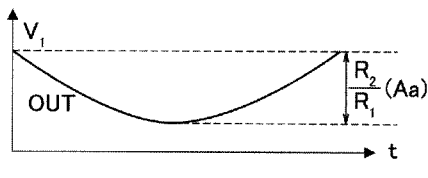
Figure 6K:
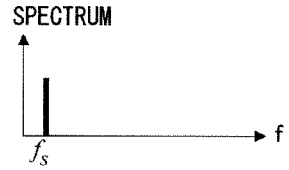
Figure 7:
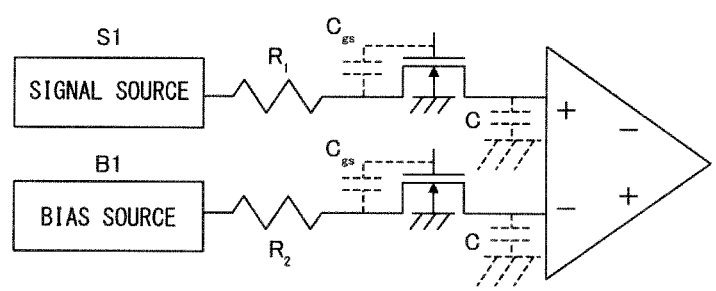
FIG. 7 is a circuit diagram of a related art chopper amplifier.
Figure 8A:
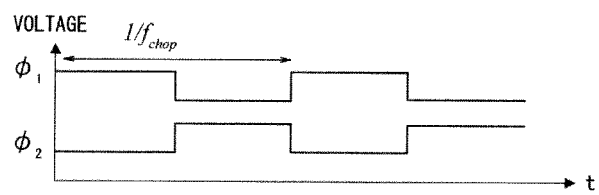
FIGS. 8A to 8F show the voltage waveforms at nodes of a related art chopper amplifier.
Figure 8B:
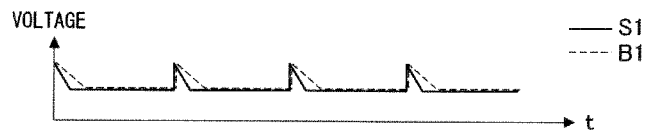
Figure 8C:
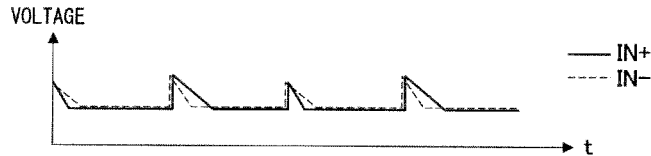
Figure 8D:
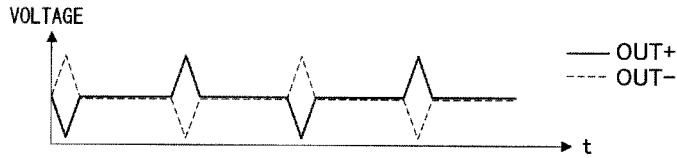
Figure 8E:
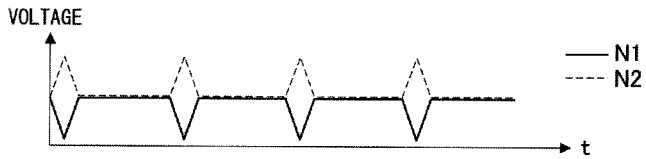
Figure 8F:
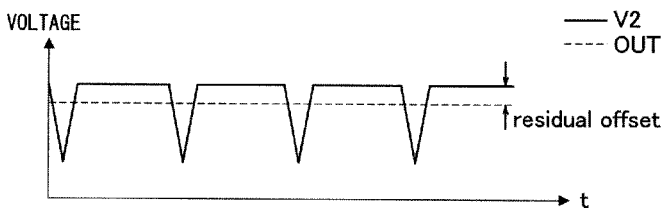

The first differential amplifier 30 outputs a first reduced modulation voltage or a first differential modulation signal Vda from the output terminal 30c and outputs a second reduced modulation voltage or a second differential modulation signal Vdb from the output terminal 30d. The first reduced modulation voltage is obtained by subtracting the modulation voltage Vha from the modulation voltage Vhb and the second reduced modulation voltage is obtained by subtracting the modulation voltage Vhb from the modulation voltage Vha. The first and second reduced modulation voltages Vda, Vdb are shown in FIG. 3C. FIG. 3C corresponds to FIGS. 6F, 6G and Vda, Vdb include 1/f noise and spike noise.

The first reduced modulation voltage Vda is input to the input terminal 40a of the chopper demodulator 40 and the second reduced modulation voltage Vdb is input to the input terminal 40b.

Figure 3D:
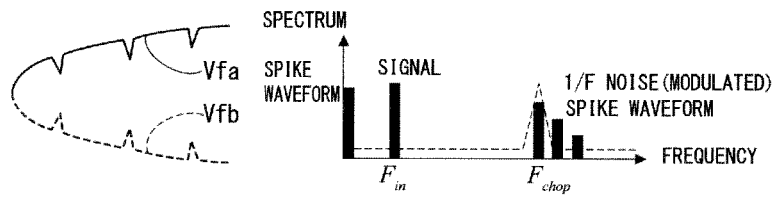
Figure 3E:
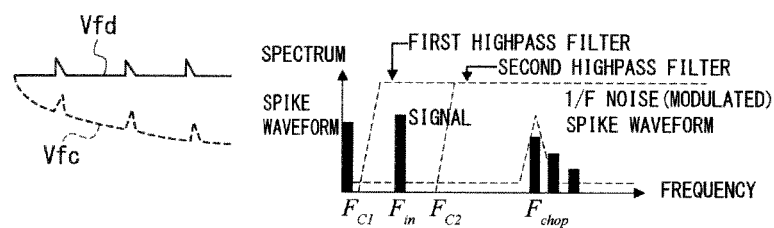

The chopper demodulator 40 turns on and off the NMOS transistors Q5 to Q8 by the gate control signals φ2 to demodulate the first and second reduced modulation voltages Vda, Vdb and output demodulation voltages Vfa, Vfb from the output terminals 40c, 40d, as shown in FIG. 3D. The demodulation voltage Vfb or second demodulation signal is equivalent to an inversion of the demodulation voltage or first demodulation signal Vfa.

The demodulation voltages Vfa, Vfb include the detection signal G1 in a frequency band $F_{in}$, a noise in a frequency band around the frequency $F_{chop}$ converted by demodulation of the 1/f noise, and a spike waveform in a wavelength band of DC components, $F_{chop}$, $3F_{chop}$ .... The demodulation voltage Vfb is input to the first and second highpass filters 50, 51.

The first highpass filter 50 cuts off the frequency $F_{c1}$ or less being lower than the frequency $F_{in}$ of the detection signal and outputs a demodulation voltage or signal Vfc including the detection signal G1 with the frequency $F_{in}$, noise in a frequency band about the frequency $F_{chop}$, and spike waveform in a wavelength band of DC components, $F_{chop}$, $3F_{chop}$ .... Meanwhile, the second highpass filter 51 cuts off the frequencies $F_{c2}$ or less being higher than the frequency $F_{in}$ and outputs a demodulation voltage or signal Vfd including no detection signal components G1.

The demodulation voltage Vfd includes a noise in a frequency about the $F_{chop}$ and a spike waveform in a wavelength band of DC components, $F_{chop}$, $3F_{chop}$ ....

The demodulation voltages Vfc, Vfd are input to the input terminals 60b, 60a, respectively.

Figure 3F:
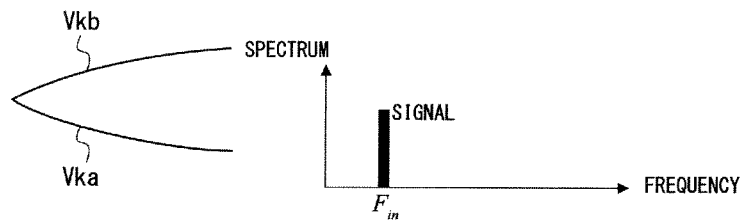

The third differential amplifier 60 outputs a first difference voltage Vka from the output terminal 60c and a second difference voltage Vkb from the output terminal 60d, as shown in FIG. 3F. The first difference voltage Vka is obtained by subtracting the demodulation voltage Vfd from the demodulation voltage Vfc and the second difference voltage Vkb is obtained by subtracting the demodulation voltage Vfc from the demodulation voltage Vfd. Thereby, they include only the detection signal components G1 with the noise around the $F_{chop}$ and spike waveform in a wavelength band of DC components, $F_{chop}$, $3F_{chop}$ ... removed.

The first and second difference voltages Vka, Vkb are input to the input terminals 70a, 70b of the second differential amplifier 70 from the output terminals 60c, 60d of the third differential amplifier 60.

Figure 3G:
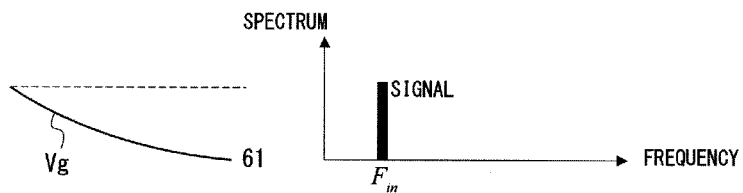

The second differential amplifier 70 outputs a signal voltage Vg which is obtained by subtracting the second difference voltage Vkb input to the input terminal 70b from the first difference voltage Vka input to the input terminal 70a, as shown in FIG. 3G.

Thus, with the spike noise and 1/f noise removed, the signal voltage Vg is free from residual offsets.

Second Embodiment

Figure 4:
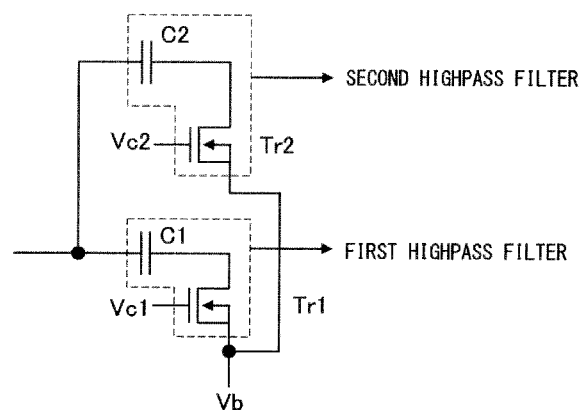
FIG. 4 shows the structure of highpass filters according to a second embodiment.
Figure 5:
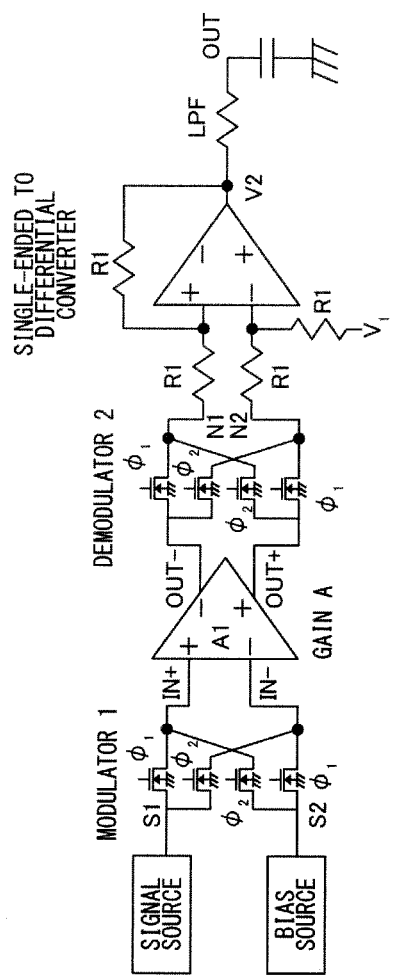
FIG. 5 is a block diagram of the structure of a related art chopper amplifier.

Another example of first and second highpass filters are described referring to FIG. 4. First and second highpass filters comprise capacitors C1, C2 and MOS transistors Tr1, Tr2, respectively.

The cutoff frequency of the first highpass filter needs to be set to a low value due to the low frequency band of the detection signal G1. For example, considering the capacitance and resistance of a $1^{st}$ order highpass filter with cutoff frequency of 1 Hz, when capacitance is set to 1 pF, the highpass filter requires resistance of 160 GΩ. In general a resistance of 160 GΩ made of a polysilicon element on a semiconductor substrate requires an enormous area.

In view of this, to realize a highpass filter with a smaller area and a low cutoff frequency, a very large-resistance element can be formed by setting a gate-source voltage Vgs of the MOS transistor Tr1 to a threshold voltage or less. This is because the smaller the voltage Vgs, the larger the resistance the MOS transistor Tr1 can equivalently exert.

Note that the third differential amplifier 60 in the above embodiment can be omitted.

Although the present invention has been described in terms of exemplary embodiments, it is not limited thereto. It should be appreciated that variations or modifications may be made in the embodiments described by persons skilled in the art without departing from the scope of the present invention as defined by the following claims.

What is claimed is:

1. A chopper amplifier comprising:
a chopper modulator to modulate a certain detection signal and a bias voltage by a certain control signal and output a chopper modulation signal;
a first differential amplifier to differentially amplify the chopper modulation signal from the chopper modulator and output a differential modulation signal;
a chopper demodulator to demodulate the differential modulation signal from the first differential amplifier by the control signal and output a demodulation signal;
a second differential amplifier to extract a detection signal component from the demodulation signal; and
a plurality of filters connected at an input terminal of the second differential amplifier and having different cutoff frequencies from each other relative to the demodulation signal, wherein
the filters include a first highpass filter and a second highpass filter having different cutoff frequencies which satisfy the following relation:

$$F_{c1} < F_{in} < F_{c2} << F_{chop}$$

where $F_{c1}$ is the cutoff frequency of the first highpass filter, $F_{c2}$ is the cutoff frequency of the second highpass filter, $F_{in}$ is a frequency of the detection signal, and $F_{chop}$ is a frequency of the control signal.

2. The chopper amplifier according to claim 1, wherein:
the chopper demodulator is adapted to output a first demodulation signal based on the differential modulation signal from the first differential amplifier and a second demodulation signal which is generated by inversing the first demodulation signal; and
either of the first and second demodulation signals is input to the filters.

3. The chopper amplifier according to claim 1, further comprising
a fully differential amplifier interposed between the filters and the second differential amplifier.

4. The chopper amplifier according to claim 1, wherein:
the first and second highpass filters comprise capacitors and resistances, respectively; and
the resistance comprise MOS transistors, respectively.

* * * * *